US010050362B2

(12) United States Patent
Abel et al.

(10) Patent No.: US 10,050,362 B2
(45) Date of Patent: Aug. 14, 2018

(54) ELECTRONIC CIRCUIT CARD WITH CONNECTOR EDGE HAVING ALTERNATED TX AND RX PINS ASSIGNMENT

(71) Applicant: International Business Machines Corporation, Armonk, NY (US)

(72) Inventors: Francois Abel, Rueschlikon (CH); Andreas Doering, Zufikon (CH); Ronald P. Luijten, Thalwil (CH); Mauro Spreafico, Sesto San Giovanni (IT); Beat Weiss, Edkubach (CH)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 15/059,475

(22) Filed: Mar. 3, 2016

(65) Prior Publication Data

US 2017/0256874 A1 Sep. 7, 2017

(51) Int. Cl.
*H05K 7/00* (2006.01)
*H01R 12/73* (2011.01)
*H05K 1/02* (2006.01)
*G06F 13/42* (2006.01)

(52) U.S. Cl.
CPC ........... *H01R 12/737* (2013.01); *G06F 13/42* (2013.01); *H05K 1/0231* (2013.01); *H05K 1/0296* (2013.01); *H05K 2201/10015* (2013.01); *H05K 2201/10507* (2013.01)

(58) Field of Classification Search
CPC .... G06F 13/42; H01R 12/737; H05K 1/0231; H05K 1/0296; H05K 2201/10015; H05K 2201/10507
See application file for complete search history.

(56) References Cited

U.S. PATENT DOCUMENTS

| 9,160,116 B2 | 10/2015 | Xiao et al. |
| 2006/0049511 A1* | 3/2006 | Schaefer ................ H01L 24/03 257/700 |

(Continued)

FOREIGN PATENT DOCUMENTS

| CN | 1374825 A | 10/2002 |
| CN | 102969624 A | 3/2013 |

*Primary Examiner* — Yuriy Semenenko
(74) *Attorney, Agent, or Firm* — Scully, Scott, Murphy & Presser, P.C.; Daniel Morris, Esq.

(57) ABSTRACT

An electronic circuit card comprises a printed circuit board with electronic components. The electronic components comprise drivers for transmitting transmit (TX) signals and receivers for receiving receive (RX) signals, according to several groups of interface signals. There is further provided a connector edge, arranged at an edge of the card, and configured to allow the card to be connected to an external connector. This connector edge comprises two subsets of symmetric pins on respective (opposite) sides thereof. The drivers and the receivers are connected to the pins, for respectively conveying the TX signals and the RX signals. Pins are assigned such that, for each of the several groups of supported interface signals, any pin (of any of the subsets) connected to transmit TX signals is located opposite a pin (of the other subset) connected to receive RX signals. Pairs of consecutive pins (on each side) typically come in differential pairs.

20 Claims, 5 Drawing Sheets

(56) References Cited

U.S. PATENT DOCUMENTS

| | | | |
|---|---|---|---|
| 2008/0123247 A1* | 5/2008 | Randall | H01G 4/232 |
| | | | 361/306.2 |
| 2011/0149740 A1* | 6/2011 | Cases | H04J 3/047 |
| | | | 370/241 |
| 2012/0028502 A1* | 2/2012 | Yeh | H01R 12/57 |
| | | | 439/626 |
| 2014/0134879 A1* | 5/2014 | Xiao | H01R 12/73 |
| | | | 439/620.01 |
| 2016/0226734 A1* | 8/2016 | Pandey | H04B 3/00 |
| 2016/0380393 A1* | 12/2016 | Wig | H05K 1/0218 |
| | | | 439/62 |
| 2017/0242818 A1* | 8/2017 | Hampikian | G06F 13/4068 |
| 2017/0286353 A1* | 10/2017 | Tamarkin | G06F 13/409 |
| 2017/0366218 A1* | 12/2017 | Larson | H04W 4/005 |

* cited by examiner

| Pin # | Pin function | Pin # | Pin function | |
|---|---|---|---|---|
| 1 | | 2 | | |
| 3 | Network Interface-1-TX+ | 4 | Network Interface-1-RX+ | |
| 5 | Network Interface-1-TX- | 6 | Network Interface-1-RX- | |
| 7 | | 8 | | |
| 9 | Network Interface-2-RX+ | 10 | Network Interface-2-TX+ | |
| 11 | Network Interface-2-RX- | 12 | Network Interface-2-TX- | |
| 13 | | 14 | | |
| 15 | Network Interface-3-TX+ | 16 | Network Interface-3-RX+ | |
| 17 | Network Interface-3-TX- | 18 | Network Interface-3-RX- | |
| 19 | | 20 | | Network Interface group (G1) |
| 21 | Network Interface-4-RX+ | 22 | Network Interface-4-TX+ | |
| 23 | Network Interface-4-RX- | 24 | Network Interface-4-TX- | |
| 25 | | 26 | | |
| 27 | Network Interface-5-TX+ | 28 | Network Interface-5-RX+ | |
| 29 | Network Interface-5-TX- | 30 | Network Interface-5-RX- | |
| 31 | | 32 | | |
| 33 | Network Interface-6-RX+ | 34 | Network Interface-6-TX+ | |
| 35 | Network Interface-6-RX- | 36 | Network Interface-6-TX- | |
| 37 | | 38 | | |
| 39 | | 40 | | |
| 41 | | 42 | | |
| 43 | | 44 | | |
| 45 | System Bus-1-TX+ | 46 | System Bus-1-RX+ | |
| 47 | System Bus-1-TX- | 48 | System Bus-1-RX- | |
| 49 | | 50 | | |
| 51 | System Bus-2-RX+ | 52 | System Bus-2-TX+ | |
| 53 | System Bus-2-RX- | 54 | System Bus-2-TX- | |
| 55 | | 56 | | |
| 57 | System Bus-3-TX+ | 58 | System Bus-3-RX+ | |
| 59 | System Bus-3-TX- | 60 | System Bus-3-RX- | |
| 61 | | 62 | | |
| 63 | System Bus-4-RX+ | 64 | System Bus-4-TX+ | |
| 65 | System Bus-4-RX- | 66 | System Bus-4-TX- | |
| 67 | | 68 | | System Bus Interface group (G2) |
| 69 | System Bus-5-TX+ | 70 | System Bus-5-RX+ | |
| 71 | System Bus-5-TX- | 72 | System Bus-5-RX- | |
| 73 | | 74 | | |
| 75 | System Bus-6-RX+ | 76 | System Bus-6-TX+ | |
| 77 | System Bus-6-RX- | 78 | System Bus-6-TX- | |
| 79 | | 80 | | |
| 81 | System Bus-7-TX+ | 82 | System Bus-7-RX+ | |
| 83 | System Bus-7-TX- | 84 | System Bus-7-RX- | |
| 85 | | 86 | | |
| 87 | System Bus-8-RX+ | 88 | System Bus-8-TX+ | |
| 89 | System Bus-8-RX- | 90 | System Bus-8-TX- | |
| 91 | | 92 | | |

FIG. 6

ELECTRONIC CIRCUIT CARD WITH CONNECTOR EDGE HAVING ALTERNATED TX AND RX PINS ASSIGNMENT

BACKGROUND

The invention relates in general to the field of electronic circuit cards with connector edges, whose pin connectors are subject to a pinout assignment, as well as to packagings comprising such cards. In particular, embodiments of the invention are directed to compute node cards and to packaging involving dense arrangements of such compute node cards.

One knows electronic circuit cards, such as expansion cards and computer memory cards, and packaging involving assemblies of such cards, as in servers and datacenters, where such cards may be compute node cards, storage node cards, and switch node cards, etc. Electronic circuit cards comprise electronic components mounted on a printed circuit board (or PCB), for electronic- or computer-related applications. Such cards are typically equipped with edge connectors. An edge connector is an edge portion of the PCB that comprises connectors intended to be plugged into a matching connector. Edge connectors are commonly used in computerized devices for expansion slots for peripheral cards.

The functions of the electrical connectors (which can convey power- or signaling-related signals) are specified according to a given pinout assignment, to prevent connection failures or damages. Once connected, a contact of a connector mates with a contact on a counterpart connector that is assigned a compatible function, according to this assignment. Several assignment strategies are known, which depend on the connector types and the types of signals to be conveyed via the pin connector.

SUMMARY

According to a first aspect, the present invention is embodied as an electronic circuit card. The latter notably comprises a printed circuit board, or PCB, with electronic components thereon. Such components comprise drivers for transmitting TX signals and receivers for receiving RX signals, according to several groups of interface signals. They further comprise a connector edge, arranged at an edge of the card, and configured to allow the card to be connected to an external connector. This connector edge comprises two subsets of symmetric pins on respective (opposite) sides thereof. The drivers and the receivers are connected to said pins, for the latter to convey the TX signals and the RX signals. A pin assignment is devised, such that, for each of the several groups of supported interface signals, any pin (of any of the subsets) that is connected to transmit TX signals is located opposite to a pin (of the other subset) that is connected to receive RX signals.

In embodiments, the drivers and the receivers are connected to said pins, such that, for each of the several groups of interface signals and for each $k \in [0, \ldots, n]$, $n > 0$: a given pin of one of the subsets may transmit TX signals for bit[k]; and a pin of the other one of the subsets, which is opposite to said given pin, may receive RX signals for bit[k].

Pairs of consecutive pins (on each side) typically come in differential pairs. For instance, the drivers and the receivers may be arranged such that: the first subset of pins comprises both a first pair of consecutive pins for TX signals and a second pair of consecutive pins for RX signals; and the second subset of pins comprises both a third pair of consecutive pins for RX signals and a fourth pair of consecutive pins for TX signals. In this arrangement, pins of the third pair are opposite to the pins of the first pair and pins of the fourth pair are opposite to the pins of the second pair.

Several groups of interface signals may be supported, including one or more of the following groups: storage; network; system bus; management; test; and power supplies signals.

According to another aspect, the invention is embodied as a packaging comprising a carrier board with several card edge connectors mounted parallel thereon; and a set of electronic circuit cards such as described above, each plugged parallel into respective card edge connectors.

Electronic devices and packagings embodying the present invention will now be described, by way of non-limiting examples, and in reference to the accompanying drawings.

BRIEF DESCRIPTION OF SEVERAL VIEWS OF THE DRAWINGS

FIG. 6 is a table capturing a pin assignment for two groups of interface signals, as involved in embodiments; and FIG. 7 depicts parallel traces etched on one or more (superimposed) layers of the carrier board having pin assignments to simplify the wiring and provide non-crossing traces on the carrier board.

Figure 1:
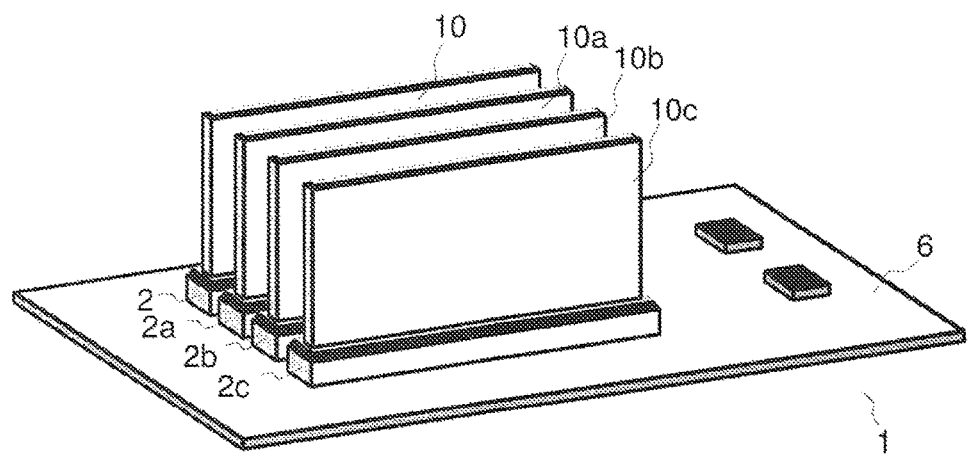
FIG. 1 is a 3D view of a packaging comprising several electronic circuit cards mounted parallel onto a carrier board of the packaging, according to embodiments.

The accompanying drawings show simplified representations of devices or parts thereof, as involved in embodiments. In particular, the number of cards involved in the packaging of FIG. 1 and the number of pin connectors involved in the pedagogical examples of FIGS. 3-6 are restricted, on purpose, for the sake of clarity and understanding the present pin assignment strategies. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

In reference to FIGS. 1-5, an aspect of the invention is first described, which concerns an electronic circuit card 10, e.g., a compute node card, which may be used in a packaging 1 such as schematically illustrated in FIG. 1.

The card 10 comprises a printed circuit board 4 (FIG. 2), or PCB, with electronic components 11, 12, 14, 15, 16 and 17 thereon. Such components notably comprise drivers 14 for transmitting transmit (TX) signals and receivers 15 for receiving receive (RX) signals. TX drivers and RX receivers are known per se.

In present embodiments, the components 11, 12, 14, 15, 16 and 17 are assumed to be configured so as to support several groups G1, G2, . . . , of interface signals, as discussed later in reference to FIGS. 3 and 6.

The card 10 further comprises a connector edge 12. This connector 12 is basically an edge connector, such as discussed in the background section. I.e., the present connector 12 is an on-card connector (typically a multi-pin, male connector), sometimes called "card-edge connector" in the literature. Yet, it is herein referred to as a "connector edge" to avoid confusion with the external connector mounted on the carrier board 6 (typically a female socket, also called "card-edge connector" or "riser card-edge connector", sometimes).

Figure 2:
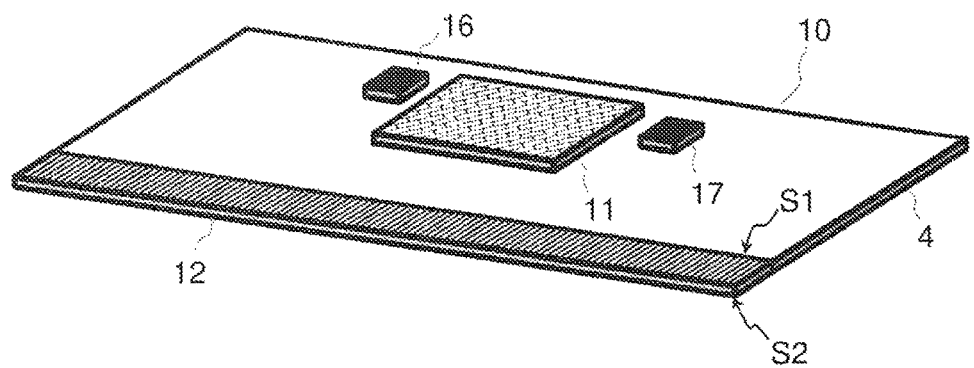
FIG. 2 is a 3D view of an electronic circuit card with an edge connector, according to embodiments.

By definition, the connector edge 12 is arranged at an edge of the card 10. Just like in prior art approaches, this connector 12 is mechanically configured to allow the card 10 to be connected to an external connector 2, 2a-2c that is typically mounted on the carrier board 6, as depicted in FIG. 1. The connector edge 12 comprises two subsets of symmetric pins on respective, opposite sides S1, S2 of the card edge, as indicated in FIG. 2. As better seen in FIGS. 4-5, said subsets comprise a first subset of pins P1, P3, P5 . . . P15 on one side S1 and a second subset P2, P4, P6 . . . P16 on the other side S2 of the connector edge 12. I.e., a subset of pin corresponds to one side of the connector edge area 12 (or the board 4) and, accordingly, references S1, S2 are hereafter interchangeably used for the opposite sides of the connector edge 12 (or the board 4), as well as for the subsets of pins.

The drivers 14 and receivers 15 are connected to pins P1-P16 for the latter to convey the TX signals and the RX signals, as discussed below in detail in reference to FIG. 3. Remarkably here, the pin assignment is constrained such that, for each of the several groups G1, G2, etc., of interface signals supported by the card components, any pin (e.g., pin P1 in FIG. 4) of any of the subsets (e.g., on side S1) that is connected to transmit TX signals is located opposite to a pin (e.g., P2, which typically is symmetric with P1 with respect to an average plane of the connector edge 12) of the other one of the subsets (e.g., on side S2) that is connected to receive RX signals.

The above configuration allows the wiring between adjacent and parallel cards to be simplified, when cards 10, 10a-c are plugged parallel onto a carrier board 6, e.g., via respective edge connectors 2, 2a-c. In particular, this makes it possible to design non-crossing traces and therefore maintain a good signal quality, a thing of particular importance in dense card arrangements as contemplated herein.

Embodiments discussed below notably allow to define bus types needed on a connector edge for a universal microserver, involving a dense arrangement of cards. The present pin assignment strategies make it possible to obtain a simple wiring on the carrier board and, in particular, to increase the density of the node cards with respect to the placement of the decoupling capacitors. This can be achieved by alternating the TX and RX pins on each side, while keeping differential pairs next to each other on a same side and alternating TX and RX pin pairs on each side of the connector 12. This will be discussed in detail in reference to FIGS. 3-6.

Comments are in order:

The present electronic circuit cards 10 are preferably embodied as compute node cards, comprising one or more electronic circuit components 11, 16, 17, including, e.g., a compute chip 11 and support chips 16, 17;

More generally though, a card 10 according to embodiments may be any card with any function that involves (high speed) signals from several group of interface signals, e.g., like a storage node, a switch node, etc., where electronic components of the card are connected to the drivers 14 and the receivers 15 for processing signals transmitted and/or received via the drivers and the receivers;

The present cards 10 typically have a form factor, inherited from the basis PCB form factor, as usual in the art;

Pins are conductors, which may have any suitable shape. In this document, "pins" means any type of contact, i.e., an electrical connector, without any prejudice as to the actual shape of the connector; and By definition, a card 10 such as described above is typically intended to interact with at least one other, similar card, to compute and/or process data, by receiving and/or transmitting signals.

In embodiments, the pin assignment is further designed such that, for each of the several groups G1, G2 of supported interface signals and for each k∈[0, . . . , n], n>0: a given pin (e.g., P1 in FIGS. 4-5) of one subset (e.g., S1) may transmit TX signals for bit[k]; and a pin (e.g., P2) of the other subset (e.g., S2), which is opposite to said given pin P1, may receive RX signals for bit[k]. The opposite pin P2 is typically the symmetric of pin P1 with respect to the average plane of the connector edge 12.

Pins for TX and RX pairs may further be alternated between the two sides S1, S2 of the connector edge 12 in an even/odd fashion, to allow decoupling capacitors to be evenly distributed on the two sides S1, S2 of the connector edge 12. Eventually, this allows to increase the component density on the card as well as improve signal quality, as discussed in more detail below.

For instance, in a trivial example (assuming no differential pairs yet), the drivers and receivers may be connected to four pins (two pins on each side), such that, for each group of interface signals:

Pin 1 on one side S1 may transmit TX signals for bit[0];

Pin 2 (on the other side S2), which is symmetric with pin 1 with respect to the average plane of the connector edge, may receive RX signals for bit[0];

Pin 3 (on S1) may receive RX signals for bit[1]; and

Pin 4 (S2), symmetric with pin 3, may transmit TX signals for bit[1].

Note that, in the above example, pins 1 and 3 (respectively 2 and 4) are not necessarily (immediately) consecutive pins as additional pins (e.g., for power supply, ground signal, etc.) may be intercalated, as discussed later in reference to FIGS. 4-6.

Figure 3:
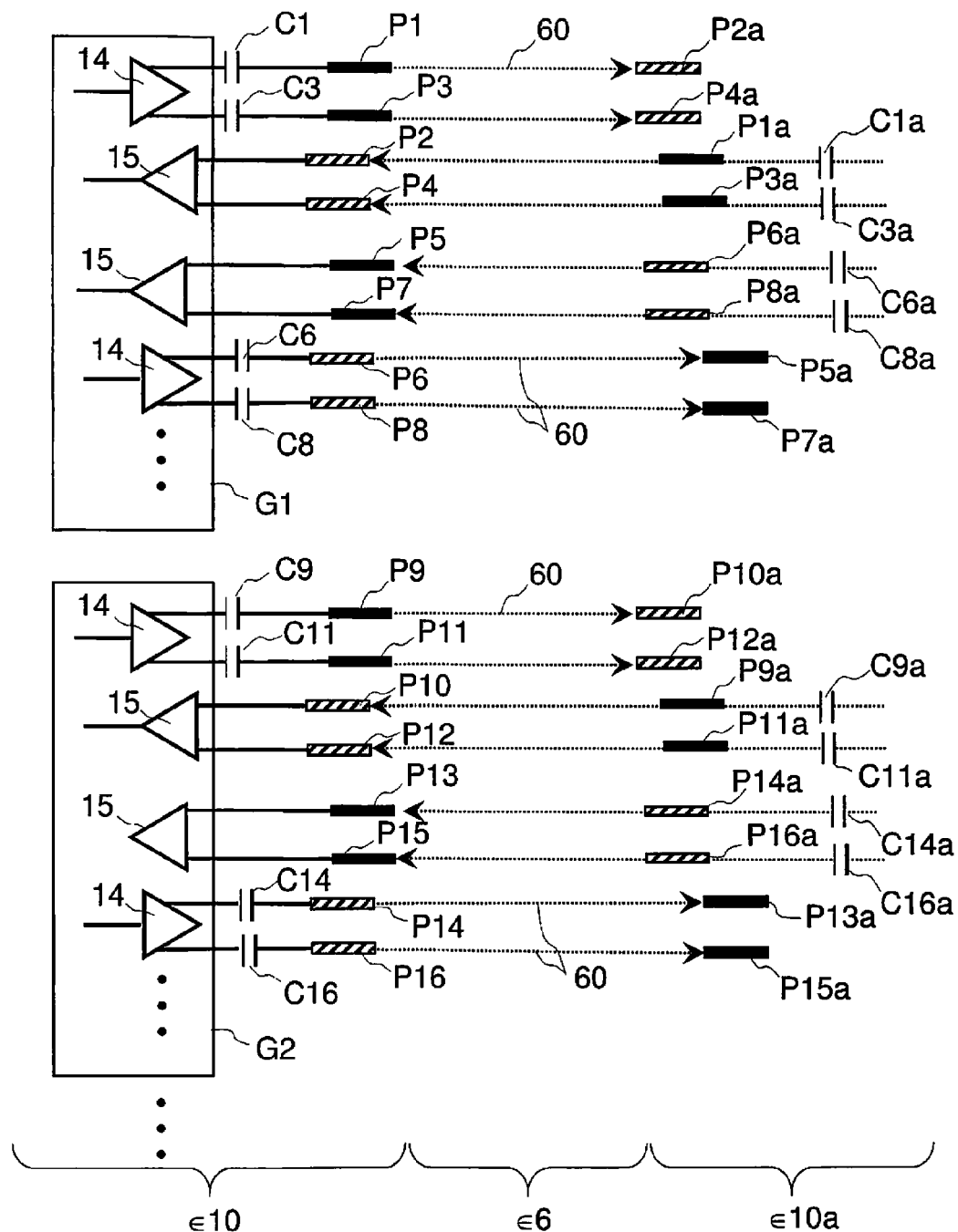
FIG. 3 is a diagram schematically illustrating a possible wiring scheme for selected components of the electronic circuit card of FIG. 2, supporting several groups of interface signals, as involved in embodiments.
Figure 4:
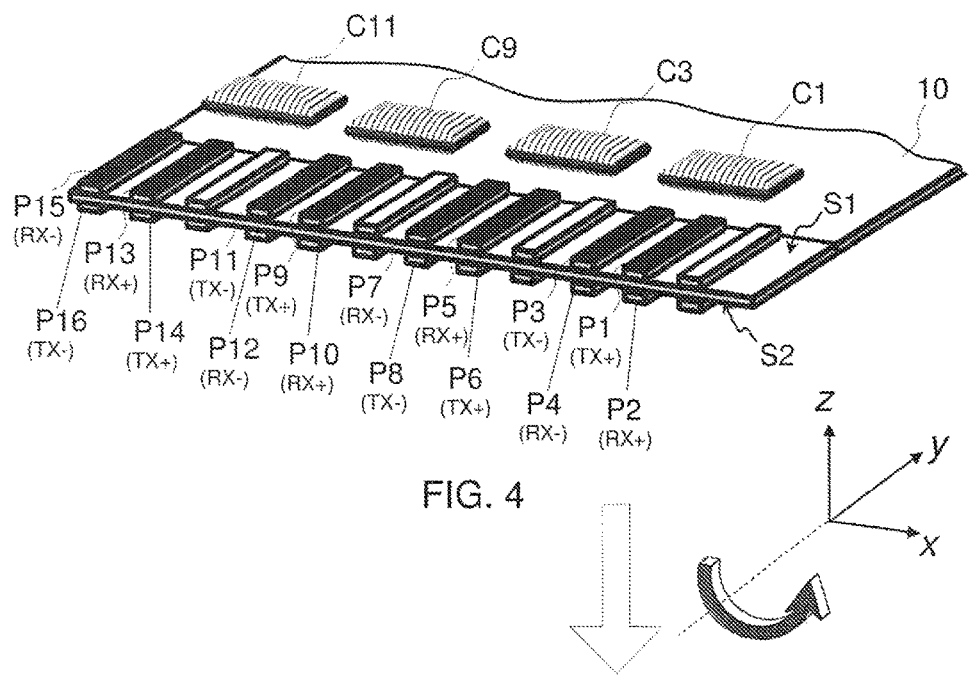
FIGS. 4 and 5 show 3D views of respective sides of an electronic circuit card, illustrating how pins can be alternated on each side of and across the edge connector of the card, according to embodiments.
Figure 5:
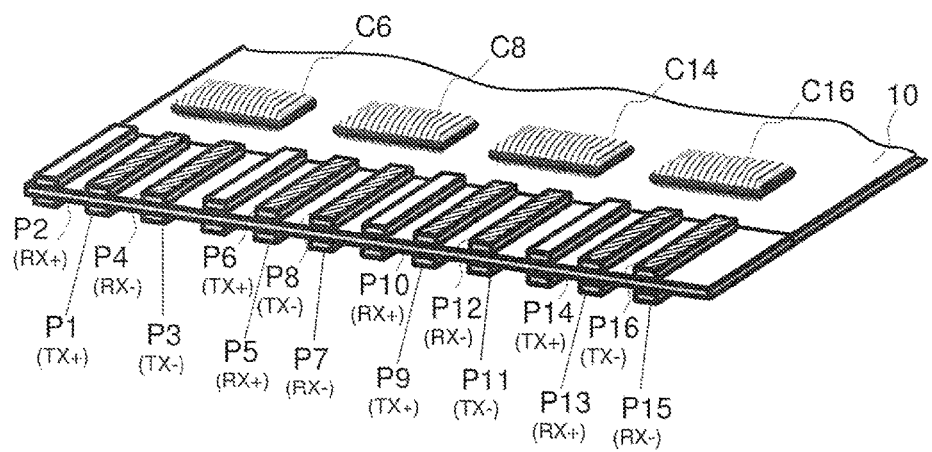

Referring now more specifically to FIGS. 3-5, pins are typically arranged in pairs, be it to convey signals in differential pairs. Namely, the first subset of pins (i.e., P1, P3, P5-P15) notably comprises a first pair (P1, P3) of consecutive TX pins (i.e., pins assigned TX signals) and a second pair (P5, P7) of consecutive RX pins. Similarly, the second subset of pins P2, P4, P6-P16 comprises both a third pair (P2, P4) of consecutive RX pins and a fourth pair (P6, P8) of consecutive TX pins.

Interestingly, and as evoked earlier, pair of pins may be further alternated as follow. Pins P2, P4 of the third pair are opposite to the pins P1, P3 of the first pair and pins P6, P8 of the fourth pair are opposite to the pins P5, P7 of the second pair, as assumed in FIGS. 3-5.

For example, in the first subset S1 of pins, a first pair of consecutive TX pins may precede (immediately or not) a second pair of consecutive RX pins, while, in the second subset S2, a third pair of consecutive RX pins precedes (immediately or not) a fourth pair of consecutive TX pins, where pins of the third pair are symmetric to the pins of the first pair and pins of the fourth pair are symmetric to pins of the second pair. In the above example, pin pairs may be immediately consecutive, or not, inasmuch as one or more pins (other than TX/RX pins) may be intercalated, as exemplified in FIG. 6.

The above design is particularly suited for differential pairs. For instance, in the above example, each of the first pair (P1, P3), the second pair (P5, P7), the third pair (P2, P4) and the fourth pair (P6, P8) of consecutive pins may be connected to convey signals in differential pairs, as denoted by references TX+, TX−; RX+, RX− in FIGS. 3-6.

For example, TX pins for even bits may be arranged on a first side S1 of the connector edge 12, while RX pins for even bits are symmetrically arranged on the opposite side S2. TX and RX pins for odd bits will be conversely arranged. In other words, TX and RX pin pairs may be alternated on each of the two sides S1, S2 of the connector.

Many high-speed transmission standards require series decoupling capacitors between the driver (TX) and receiver (RX). Only one capacitor per transmission line connection is required. Typically TX and RX for a given transmission line are on different circuit boards and capacitors can be placed either on the TX- or RX-side of such circuit boards.

As we shall see, the alternating RX/TX pin arrangement discussed above allows capacitors to be evenly distributed on the two sides S1, S2 of the card. For instance, referring back to the above example with four pairs of pins, a preferred capacitor arrangement is one where, for a set of AC coupling capacitors provided on each side S1, S2 of the connector edge 12:

Pins in each of the first pair (P1, P3) and the fourth pair (P6, P8) of consecutive TX pins are, each, connected to one of the AC coupling capacitors (namely C1, C3, C6, C8); while None of the RX pins of the second and third pair is connected to an AC coupling capacitor (at least not directly).

This, eventually, reduces the space occupied by the components on a given side and eases the component layout and wiring. Thus, embodiments of the invention jointly solve two problems: (i) they allow essentially straight, non-crossing wiring on the carrier board connecting multiple node boards, while (ii) making it possible to optimize the layout and wiring for the AC coupling capacitors.

The above capacitor arrangement can be re-iterated for each group G1, G2, etc., of interface signals. For instance, and as illustrated in FIGS. 3-5, the PCB 4 shall typically comprise a set of AC coupling capacitors (denoted by references C1, C3, C6, C8, C9, C11, C14 and C16 in the drawings), arranged such that each TX pin Pj is connected to a respective AC coupling capacitor Cj, while none of the RX pins (i.e., pins P2, P4, P5, P7, P10, P12, P13, P15) is connected to an AC coupling capacitor (at least not directly).

As known, AC coupling capacitors are provided for high-speed differential interfaces, on each TX+ and TX− path. For instance, PCIe, DP, USB3, and SATA standards require, each, that AC coupling be placed between the transmitter and the receiver. The AC coupling capacitors for both differential pair signals must typically be of the same value, have the same package size and have symmetric placement as possible.

In the embodiment of FIG. 3, pins P1-P8 are assigned to a first group G1 of signals, while pins P9-P16 are assigned to a second group G2. This configuration can be repeated as necessary to accommodate the various groups needed. As indicated in FIG. 3, pins P1-P16 (and the corresponding capacitors C1-C16) belong to one card (e.g., card 10), while pins P1a-P16a belong to an adjacent card 10a, in a packaging such as depicted in FIG. 1, where cards 10, 10a are connected to each other via the carrier board 6. Dotted arrows represent the wirings 60 (e.g., traces). The pin references for pins of card 10 in FIG. 3 are consistent with the references adopted in FIGS. 4-5. Black pins denote TX or RX pins on one side (S1) of a card, while the patterned pins denote TX or RX pins on the opposite side (S2).

In FIGS. 4 and 5, white pins are depicted, which represent intercalated pins (other than for TX/RX signals, e.g., for power supplies, ground signal, etc.). Such pins are not represented in FIG. 3, for clarity. As further illustrated in the table of FIG. 6, one or more white pins (represented here by blank fields of the table) may be intercalated between TX pairs and RX pairs on each side of the connector edge 12.

It should be kept in mind that FIG. 3 is a diagram representing the logical wiring of the components, while the actual physical and geometrical arrangement of the corresponding pin pairs is depicted in FIGS. 4-5. In particular, "black" pins and "patterned" pins are actually located on opposite sides of a same connector edge 12, which is not immediately apparent from the projected representation adopted in the diagram of FIG. 3. Still, one understands from FIG. 3, in view of FIGS. 4 and 5, that the traces 60 (dotted arrows) that connect parallel cards 10, 10a via the carrier board 6 (FIG. 1) can be made essentially straight and, therefore, non-crossing.

Figure 7:
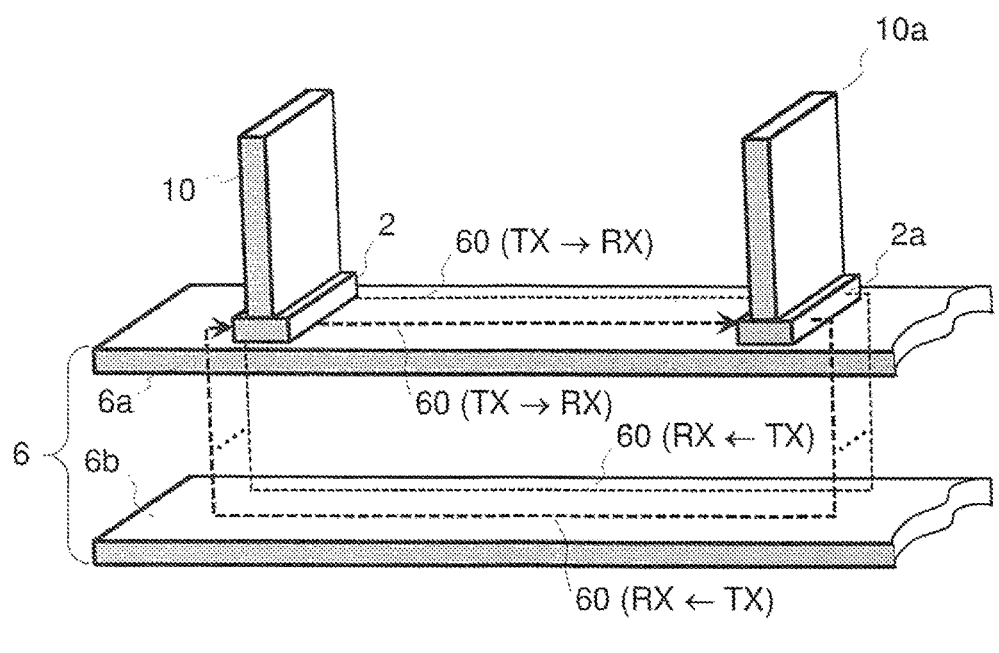
FIG. 7 shows an exploded view of a portion of the same packaging, rotated with respect to FIG. 6, which depicts a possible wiring between TX and RX pins of two cards of the packaging, according to embodiments.

For instance, and as illustrated in FIG. 7, parallel traces 60 may be etched on one or more (superimposed) layers 6a, 6b of the carrier board 6, which traces 60 connect TX pins of card 10 to opposite RX pins of card 10a. Similarly, parallel traces 60 may connect RX pins of card 10 to opposite TX pins of card 10a. The traces 60 are made as much as possible straight. Advantageously, a pair of traces that connect a pair of opposite pins on one card 10 to counterpart pins on the card 10a can be superimposed if etched on distinct layers 6a, 6b of the carrier PCB 6. I.e., a transverse pair of traces TX→RX and RX←TX extend, for their longest part, superimposed and parallel in the plane (y, z), to form parallel pairs of transverse traces along axis x, according to the Cartesian coordinate axes of FIG. 7 (consistently rotated with respect to the Cartesian coordinate axes of FIGS. 4-5), so as to minimize the wiring length. Vertical portions of the lower conductors 60 can be achieved thanks to through-vias, as known per se.

In the configurations depicted in FIGS. 3-5 only the TX pins are directly connected to AC decoupling capacitors, which allows to prevent damages, notably while handling the cards. RX pins are not connected to a capacitor, at least not directly. Still, it is understood that RX pins will nevertheless be indirectly connected to a capacitor, once the cards 10, 10a are plugged onto the board 6 and connected to each other as in FIG. 1, 3 or 7). Now, although the decoupling capacitors are preferably placed on the TX side, one understands that symmetric variants may be contemplated, where capacitors are settled on the RX side.

In preferred embodiments as depicted in FIGS. 4 and 5, capacitor pairs can be arranged as rows of capacitors, such as the pair (C1, C3), connected to pins P1, P3 and the pair (C9, C11), connected to pins P9, P11. Note that capacitor C1 extends vis-à-vis the pair of TX pins P1, P3 it connects, while the other capacitor C3 extends vis-à-vis the RX pair P5, P7 (not directly connected to any capacitor). This repeats for the next pair (C9, C11) of capacitors on side S1, so as to exploit areas vis-à-vis the (unconnected) RX pins. A similar arrangement can be provided for the capacitor pairs (C6, C8) and (C14, C16) soldered on the opposite side S2 of the connector edge 12.

Referring now more specifically to FIG. 6, the pin assignment is preferably devised such that each pin subset S1, S2 decomposes into distinct, non-overlapping clusters of consecutive pins, where the clusters are dedicated to respective, distinct groups G1, G2, etc. of interface signals. In other words, the pins allocated to each group G1, G2, etc., preferably form compact clusters of pins on each side S1, S2 of the card edge 12, subject, of course, to intercalated pins that are dedicated to other functions such as, e.g., power supply or ground. Having such compact clusters has advantages in terms of signal quality (short connections, minimize crossings, etc.).

In embodiments, the supported groups of interface signals comprise one or more (including any subset) of the following groups: storage (e.g., SATA); network (e.g., Ethernet); system bus (e.g., PCIe); management (e.g., USB); and test interface signals. Only two groups (network and system bus) are assumed in FIG. 6, for simplicity and without prejudice. For conciseness, only the TX and RX pins are indicated, it being understood that other groups of pins may likely be present, starting with pins provided for power supplies and ground signals (e.g., GND, 5V, 3V, etc.). For completeness, pins that are not allocated (or reserved for future use) may also be present.

Referring back to FIGS. 1, 2, and according to another aspect, the invention can also be embodied as a packaging 1. As already apparent from the above description, this packaging comprises, a minima, a carrier board 6 (also called baseboard or system board, depending on the context), with external connectors 2, 2a-2c mounted parallel thereon, and a set of circuit cards 10, 10a-10c. Such cards are designed according to any of the embodiments described earlier in reference to FIGS. 1-6 (but need not be identical, provided that pin assignments are ensured, which are compatible with the desired wiring scheme for the components). The cards 10, 10a-10c are plugged parallel into respective connectors 2, 2a-2c, so as to form, e.g., a dense arrangement of cards 10, 10a-10c. A particularly preferred packaging is one that comprises compute node cards, connected via the carrier board 6. Different connection topologies may be involved, depending on the applications and how the carrier board is wired, e.g., two-by-two, tree-like, cluster-like, etc.

As explained earlier, the present pin assignments make it possible to simplify the wiring and, notably, to provide non-crossing traces on the carrier board 6. Such traces may possibly extend on distinct layers of the carrier board 6, as depicted in FIG. 7.

While the present invention has been described with reference to a limited number of embodiments, variants and the accompanying drawings, it will be understood by those skilled in the art that various changes may be made and equivalents may be substituted without departing from the scope of the present invention. In particular, a feature recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other groups of interface signals may be supported, following the same pin assignment strategies as discussed herein.

What is claimed is:

1. An electronic circuit card comprising:
   a printed circuit board, or PCB, with electronic components thereon, said components comprising:
      drivers for transmitting transmit (TX) signals and receivers for receiving receive (RX) signals, according to several groups of interface signals; and
      a connector edge, at an edge of the card, the connector edge configured to allow the card to be connected to an external connector, the connector edge comprising subsets of symmetric pins on respective sides thereof, said subsets comprising a first subset and a second subset,
   wherein,
      the drivers and the receivers are connected to said pins, for the latter to convey the transmit TX signals and the RX signals, and such that, for each of the several groups of interface signals, any pin of any of the subsets that is connected to transmit TX signals is located opposite to a pin of the other one of the subsets that is connected to receive RX signals.

2. The electronic circuit card according to claim 1, wherein
   the drivers and the receivers are connected to said pins, such that, for each of the several groups of interface signals and for each $k \in [0, \ldots, n]$, $n>0$:
   a given pin of one of the subsets may transmit TX signals for bit[k]; and
   a pin of the other one of the subsets, which is opposite to said given pin, may receive RX signals for bit[k].

3. The electronic circuit card according to claim 1, wherein
   the drivers and the receivers are connected to said pins, such that:
      the first subset of pins comprises both a first pair of consecutive pins for transmit TX signals and a second pair of consecutive pins for receive RX signals; and
      the second subset of pins comprises both a third pair of consecutive pins for receive RX signals and a fourth pair of consecutive pins for transmit TX signals,
   wherein,
      pins of the third pair are opposite to the pins of the first pair and pins of the fourth pair are opposite to the pins of the second pair.

4. The electronic circuit card according to claim 3, wherein
   each of the first pair, the second pair, the third pair and the fourth pair of consecutive pins are connected to convey signals in differential pairs.

5. The electronic circuit card according to claim 1, wherein
   the PCB further comprises AC coupling capacitors, each pin for transmit TX signals being connected to a respective one of the AC coupling capacitors, while none of the pins for receive RX signals is connected to an AC coupling capacitor.

6. The electronic circuit card according to claim 3, wherein the PCB further comprises
   a set of AC coupling capacitors on each side of said connector edge; and
   pins in each of the first pair and the fourth pair of consecutive pins for transmit TX signals are connected, each, to one of the AC coupling capacitors of said connector edge, while none of the pins for receive RX signals of the second pair and the third pair is connected to an AC coupling capacitor.

7. The electronic circuit card according to claim 3, wherein
   in the first subset of pins, one or more pins are intercalated between said first pair and said second pair of consecutive pins; and
   in the second subset of pins, one or more pins are intercalated between said third pair and said fourth pair of consecutive pins.

8. The electronic circuit card according to claim 6, wherein:
   a first capacitor pair of AC coupling capacitors connected to pins of the first pair is arranged as a row of capacitors, wherein
      one capacitor of the first capacitor pair extends vis-à-vis the first pair of pins and
      another capacitor of the capacitor pair extends vis-à-vis the second pair of pins; and
   a second capacitor pair of AC coupling capacitors connected to pins of the fourth pair is arranged as a row of capacitors, wherein
      one capacitor of the second capacitor pair extends vis-à-vis the third pair of pins and
      another capacitor of the second capacitor pair extends vis-à-vis the fourth pair of pins.

9. The electronic circuit card according to claim 1, wherein
   each of the first subset of pins and the second subset of pins comprises distinct clusters of consecutive pins, each of the clusters including pins for conveying signals of a respective one of the several groups of interface signals.

10. The electronic circuit card according to claim 1, wherein
   said several groups of interface signals comprise one or more of the following actual groups:
      a group of storage interface signals;
      a group of network interface signals;
      a group of system bus interface signals;
      a group of management interface signals;
      a group of test interface signals; and
      a group of power supplies signals.

11. The electronic circuit card according to claim 10, wherein
   said several groups of interface signals comprise a subset of any two or more of said each of said actual groups.

12. The electronic circuit card according to claim 10, wherein
   said several groups of interface signals comprise each of said actual groups.

13. A packaging comprising:
   a carrier board with several card edge connectors mounted parallel thereon; and
   a set of electronic circuit cards, each according to claim 1, plugged parallel into respective ones of said several card edge connectors.

14. The packaging of claim 13, wherein
   the carrier board comprises non-crossing traces, each connecting a pin for transmit (TX) signals, respectively receive (RX) signals, of a first card of the set of electronic circuit cards to an opposite pin for receive RX signals, respectively transmit TX signals, of a second card of the set of electronic circuit cards.

15. The packaging of claim 13, wherein
   traces of said non-crossing traces, which connect a pair of opposite pins of one card of the set of electronic circuit cards to an equivalent pair of opposite pins of another card of the set of electronic circuit cards, extend on distinct layers of said PCB.

16. The packaging of claim 13, wherein
   each card of the set of electronic circuit cards comprises drivers and receivers connected to pins of said each card, such that, for each of the several groups of interface signals managed by said each card and for each $k \in [0, \ldots, n]$, $n>0$:
      a given pin of one of the subsets of said each card may transmit TX signals for bit[k]; and
      a pin of the other one of the subsets of said each card, which is opposite to said given pin, may receive RX signals for bit[k].

17. The packaging of claim 13, wherein
   each card of the set of electronic circuit cards comprises drivers and receivers connected to pins of said each card, such that:
      the first subset of pins of said each card comprises both a first pair of consecutive pins for transmit TX signals and a second pair of consecutive pins for receive RX signals; and
      the second subset of pins of said each card comprises both a third pair of consecutive pins for receive RX signals and a fourth pair of consecutive pins for transmit TX signals,
   wherein,
      pins of the third pair are opposite to pins of the first pair and pins of the fourth pair are opposite to pins of the second pair.

18. The packaging of claim 17, wherein,
   for said each card of the set of electronic circuit cards, each of the first pair, the second pair, the third pair and the fourth pair of consecutive pins are connected to convey signals in differential pairs.

19. The packaging of claim 13, wherein
   the PCB of said each card of the set of electronic circuit cards comprises AC coupling capacitors, wherein each pin for transmit TX signals is connected to one of said AC coupling capacitors, while none of the pins for receive RX signals is connected to an AC coupling capacitor.

20. The packaging of claim 17, wherein
   the PCB of said each card of the set of electronic circuit cards comprises a set of AC coupling capacitors on each side of the connector edge of said each card; and
   pins in each of the first pair and the fourth pair of consecutive pins for transmit TX signals are connected to one of the AC coupling capacitors, while none of the pins for receive RX signals of the second pair and the third pair is connected to an AC coupling capacitor.

* * * * *